(12) United States Patent
Shimizu

(10) Patent No.: US 10,291,196 B2
(45) Date of Patent: May 14, 2019

(54) METHOD FOR MANUFACTURING AN ACOUSTIC WAVE DEVICE

(71) Applicant: TAIYO YUDEN CO., LTD., Tokyo (JP)

(72) Inventor: Yohei Shimizu, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 202 days.

(21) Appl. No.: 14/581,330

(22) Filed: Dec. 23, 2014

(65) Prior Publication Data
US 2015/0188507 A1    Jul. 2, 2015

(30) Foreign Application Priority Data

Dec. 26, 2013    (JP) .................................. 2013-269532

(51) Int. Cl.
*H03H 3/08*    (2006.01)
*B26F 3/16*    (2006.01)
(Continued)

(52) U.S. Cl.
CPC ............... *H03H 3/08* (2013.01); *B23K 26/53* (2015.10); *B23K 26/57* (2015.10); *B26F 3/002* (2013.01); *B26F 3/16* (2013.01); *H03H 3/02* (2013.01); *H03H 9/02133* (2013.01); *H03H 9/25* (2013.01); *H01L 21/78* (2013.01); *H01L 21/82* (2013.01); *H01L 27/01* (2013.01); *H01L 27/016* (2013.01); *H01L 27/0805* (2013.01); *Y10T 29/42* (2015.01); *Y10T 225/12* (2015.04)

(58) Field of Classification Search
CPC ........ H03H 3/02; H03H 3/08; H03H 9/02133; H03H 9/25; B26F 3/002; B26F 3/16; B23K 26/0057; B23K 26/57; Y10T 29/42; Y10T 225/12; H01L 21/78; H01L 21/82; H01L 27/01; H01L 27/016; H01L 27/0805
See application file for complete search history.

(56) References Cited

U.S. PATENT DOCUMENTS

2002/0149295 A1*  10/2002  Onishi .................... Y10T 29/42
                                                              310/313 R
2003/0029245 A1*   2/2003  Izadnegahdar ......... Y10T 29/42
                                                              73/753
(Continued)

FOREIGN PATENT DOCUMENTS

JP    2005159379 A   *  6/2005
JP    2010-212832 A     9/2010
(Continued)

OTHER PUBLICATIONS

Japanese Office Action dated Nov. 14, 2017, in a counterpart Japanese patent application No. 2013-269532. (A machine translation (not reviewed for accuracy) attached.).

*Primary Examiner* — A. Dexter Tugbang
(74) *Attorney, Agent, or Firm* — Chen Yoshimura LLP

(57) ABSTRACT

A method for manufacturing an acoustic wave device includes: forming an altered domain in a supporting substrate by irradiating the supporting substrate with a laser light, a piezoelectric substrate being joined to an upper surface of the supporting substrate; forming a groove on an upper surface of the piezoelectric substrate so as to overlap with the altered domain; and cutting the supporting substrate at the groove.

13 Claims, 6 Drawing Sheets

(51) Int. Cl.

| | |
|---|---|
| *H03H 9/25* | (2006.01) |
| *B26F 3/00* | (2006.01) |
| *B23K 26/53* | (2014.01) |
| *H03H 3/02* | (2006.01) |
| *B23K 26/57* | (2014.01) |
| *H03H 9/02* | (2006.01) |
| *H01L 21/82* | (2006.01) |
| *H01L 21/78* | (2006.01) |
| *H01L 27/01* | (2006.01) |
| *H01L 27/08* | (2006.01) |

(56) References Cited

U.S. PATENT DOCUMENTS

| | | | |
|---|---|---|---|
| 2009/0117712 A1* | 5/2009 | Sakamoto | B23K 26/0057 438/463 |
| 2011/0304012 A1* | 12/2011 | Kim | H01L 21/016 257/531 |
| 2012/0156816 A1* | 6/2012 | Okamura | B23K 26/0057 438/33 |
| 2012/0248939 A1 | 10/2012 | Funabiki | |
| 2012/0299147 A1* | 11/2012 | Mitani | H01L 21/78 257/506 |
| 2013/0167340 A1* | 7/2013 | Nishidate | Y10T 29/42 29/25.35 |

FOREIGN PATENT DOCUMENTS

| | | |
|---|---|---|
| JP | 2012-209617 A | 10/2012 |
| JP | 2013-138362 A | 7/2013 |

\* cited by examiner

METHOD FOR MANUFACTURING AN ACOUSTIC WAVE DEVICE

CROSS-REFERENCE TO RELATED APPLICATION

This application is based upon and claims the benefit of priority of the prior Japanese Patent Application No. 2013-269532, filed on Dec. 26, 2013, the entire contents of which are incorporated herein by reference.

FIELD

A certain aspect of the present invention relates to an acoustic wave device and a method for manufacturing the same, e.g. to an acoustic wave device having a piezoelectric substrate joined to a supporting substrate, and the method for manufacturing the same.

BACKGROUND

There is known using a laser light for the cutting of the acoustic wave device. Japanese Patent Application Publication No. 2010-212832 discloses a method that forms an altered domain in a piezoelectric substrate by irradiating the piezoelectric substrate with a laser light, and then cuts the piezoelectric substrate. Japanese Patent Application Publication No. 2012-209617 discloses a method that joins a lid substrate to a base substrate, forms a cut by irradiating the lid substrate with a laser, pushes the joined substrate from a side of the base substrate and cuts the joined substrate.

There is a case where an acoustic wave device is manufactured using the piezoelectric substrate joined to a supporting substrate. However, when a substrate in which the piezoelectric substrate and the supporting substrate are joined is cut, a chipping occurs in the substrate. A flexural strength of the substrate in which the piezoelectric substrate and the supporting substrate are joined is small.

SUMMARY OF THE INVENTION

According to an aspect of the present invention, there is provided a method for manufacturing an acoustic wave device, including: forming an altered domain in a supporting substrate by irradiating the supporting substrate with a laser light, a piezoelectric substrate being joined to an upper surface of the supporting substrate; forming a groove on an upper surface of the piezoelectric substrate so as to overlap with the altered domain; and cutting the supporting substrate at the groove.

According to another aspect of the present invention, there is provided an acoustic wave device including: a supporting substrate on which an altered domain is formed, by irradiation of a laser light to a side surface of the supporting substrate; and a piezoelectric substrate that is joined on the supporting substrate, at least an upper portion of a side surface of the piezoelectric substrate being located at an inner side than a side surface of the supporting substrate.

DETAILED DESCRIPTION

Hereinafter, a description will be given of an embodiment of the present invention with reference to drawings.

First Embodiment

Figure 1A:
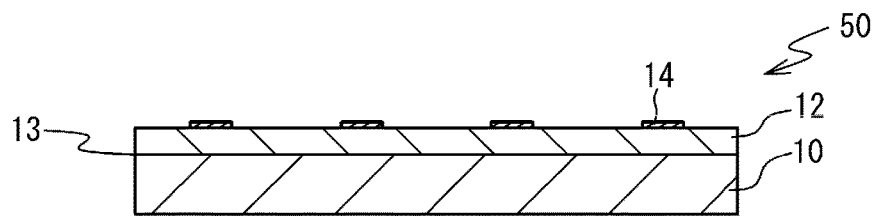
FIGS. 1A to 1C are cross-sectional views illustrating a method for manufacturing an acoustic wave device according to a first embodiment (part 1)

FIGS. 1A to 2C are cross-sectional views illustrating a method for manufacturing an acoustic wave device according to a first embodiment. A wafer 50 includes a supporting substrate 10, a piezoelectric substrate 12 and IDTs 14, as illustrated in FIG. 1A. An upper surface of the supporting substrate 10 and a lower surface of the piezoelectric substrate 12 are joined. In an interface 13 of the supporting substrate 10 and the piezoelectric substrate 12, atoms that constitutes the supporting substrate 10, and atoms that constitutes the piezoelectric substrate 12 form an amorphous layer, so that the supporting substrate 10 and the piezoelectric substrate 12 firmly join. The IDTs 14 (Interdigital Transducer) are formed on the piezoelectric substrate 12. The supporting substrate 10 is an insulating substrate such as a sapphire substrate. The piezoelectric substrate 12 is a lithium tantalite ($LiTaO_3$) substrate, for example. Each IDT 14 is a metal film such as an aluminum (Al) film, for example. A film thickness of the supporting substrate 10 is 100 to 300 μm, for example. A film thickness of the piezoelectric substrate 12 is 20 to 100 μm, for example.

Figure 1B:
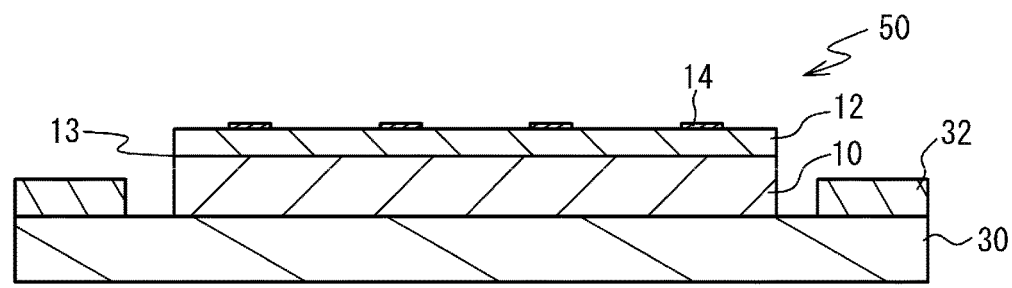
Figure 1C:
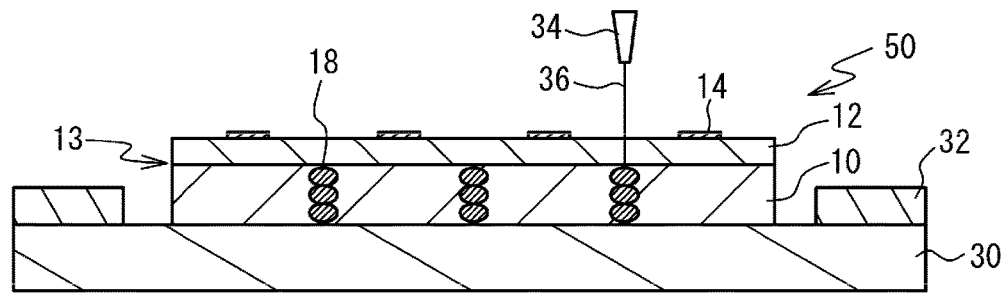

As illustrated in FIG. 1B, the lower surface of the wafer 50 is pasted on a dicing tape 30. The dicing tape 30 is fixed to a dicing ring 32. As illustrated in FIG. 1C, a laser irradiation device 34 irradiates the supporting substrate 10 with a laser light 36 via the piezoelectric substrate 12. By heat of the laser light 36, altered domains 18 in which the material of the supporting substrate 10 is reformed are is formed in the supporting substrate 10. One or more altered domain 18 is formed in a thickness direction of the supporting substrate 10. The altered domain 18 may be formed in the piezoelectric substrate 12. The laser light 36 is a green laser light, for example, and is a second harmonic of a Nd:YAG laser, for example. By using the laser light whose wavelength is about 500 nm, the altered domain 18 can be efficiently formed in the supporting substrate 10. A wavelength of the laser light 36 can be properly set according to the materials of the supporting substrate 10 and the piezoelectric substrate 12.

Figure 2A:
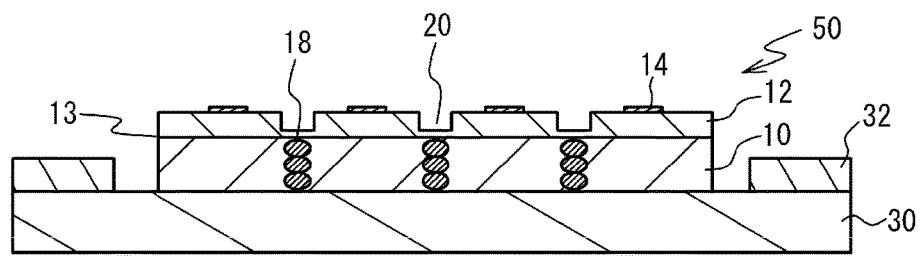
FIGS. 2A to 2C are cross-sectional views illustrating the method for manufacturing the acoustic wave device according to the first embodiment (part 2)

As illustrated in FIG. 2A, grooves 20 are formed on the upper surface of the piezoelectric substrate 12 so that the grooves 20 overlap with the altered domains 18, as seen from above. A dicing blade is used for formation of the grooves 20, for example. Although the grooves 20 may reach to the interface 13, the piezoelectric substrate 12 may remain at the bottom of the grooves 20. The altered domains 18 and the grooves 20 are formed along a cutting domain (i.e., a scribe line) for cutting the wafer 50. The cutting domain is formed in one direction and another direction which intersects the one direction when the wafer 50 is seen from above.

Figure 2B:
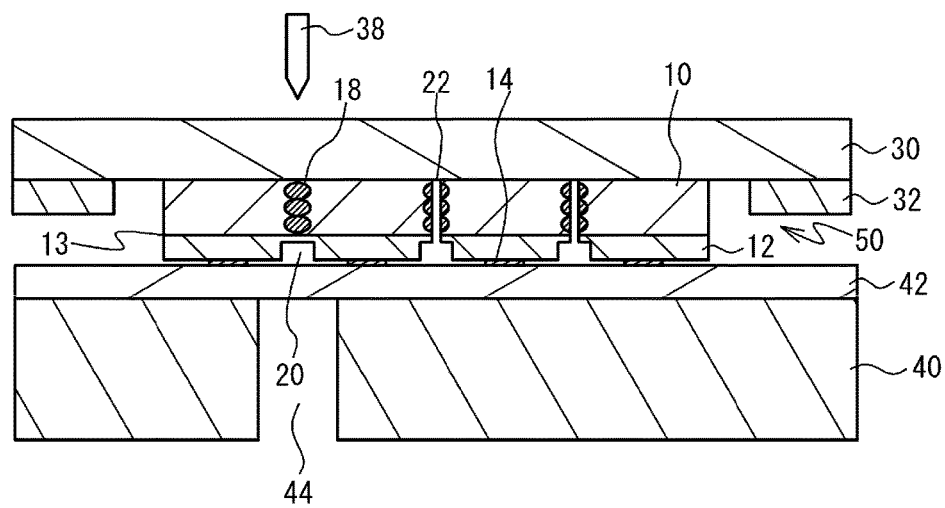

As illustrated in FIG. 2B, the upper and the lower sides of the wafer 50 are reversed. The wafer 50 is arranged on a supporting stage 40 via a protection sheet 42. The piezoelectric substrate 12 of the wafer 50 is protected by the protection sheet 42. A groove 44 is provided in the supporting stage 40 under the altered domain 18 and the groove 20. A blade 38 is pressed against the wafer 50 from above the dicing tape 30. Thereby, in domains which overlap with the altered domains 18, cutting surfaces 22 are formed in the supporting substrate 10 and the piezoelectric substrate 12, and hence the supporting substrate 10 and the piezoelectric substrate 12 are broken. When the blade 38 hits the wafer 50, the groove 44 misses downward movement of the wafer 50. The position of the groove 44 moves simultaneously with the position of the blade 38. Thereby, the wafer 50 is broken.

Figure 2C:
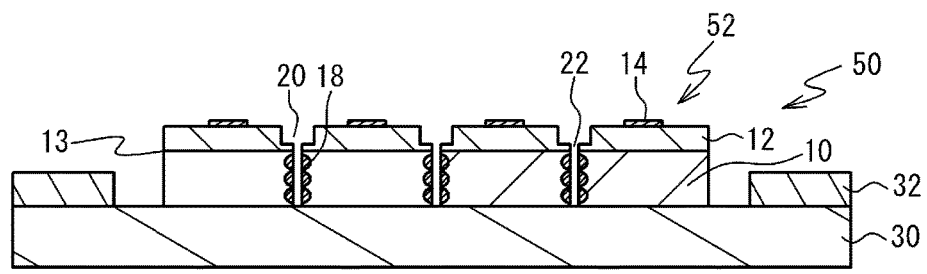

As illustrated in FIG. 2C, the wafer 50 is detached from the supporting stage 40. The upper and the lower sides of the wafer 50 are reversed. The cutting surfaces 22 are formed in the wafer 50, and the wafer 50 is divided into a plurality of chips 52. The chips 52 are picked up from the dicing tape 30.

Figure 3A:
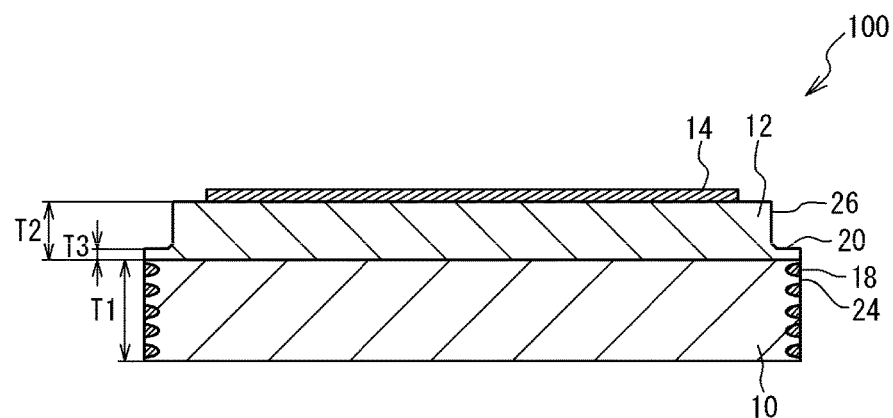
FIG. 3A is a cross-sectional view of the acoustic wave device according to the first embodiment.
Figure 3B:
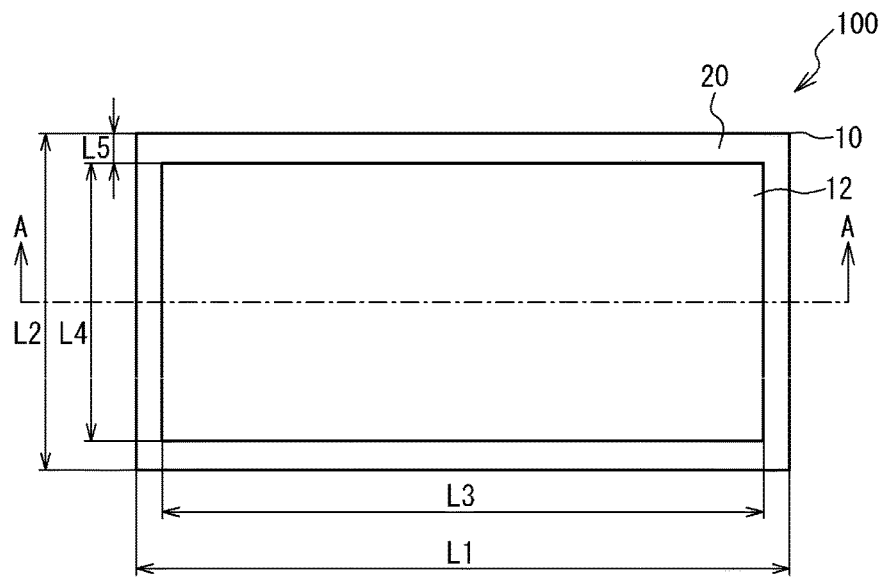
FIG. 3B is a plain view of the acoustic wave device according to the first embodiment.

FIGS. 3A and 3B are a cross-sectional view and a plain view of the acoustic wave device according to the first embodiment, respectively. FIG. 3A is a cross-sectional view taken along a line A-A in FIG. 3B. As illustrated in FIGS. 3A and 3B, the altered domains 18 are formed in the acoustic wave device chip 100 by the irradiation of the laser light to the side surfaces 24 of the supporting substrate 10. The grooves 20 are formed in the piezoelectric substrate 12. At least upper portions of the side surfaces 26 of the piezoelectric substrate 12 are located at an inner side than the side surfaces 24 of the supporting substrate 10.

Figure 4A:
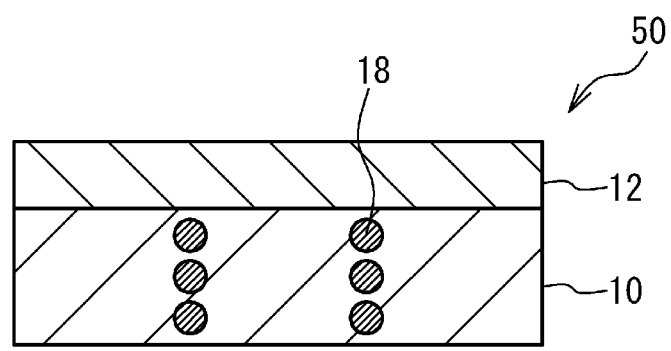
FIGS. 4A and 4B are cross-sectional views illustrating a method for manufacturing the acoustic wave device according to a comparative example 1.
Figure 4B:
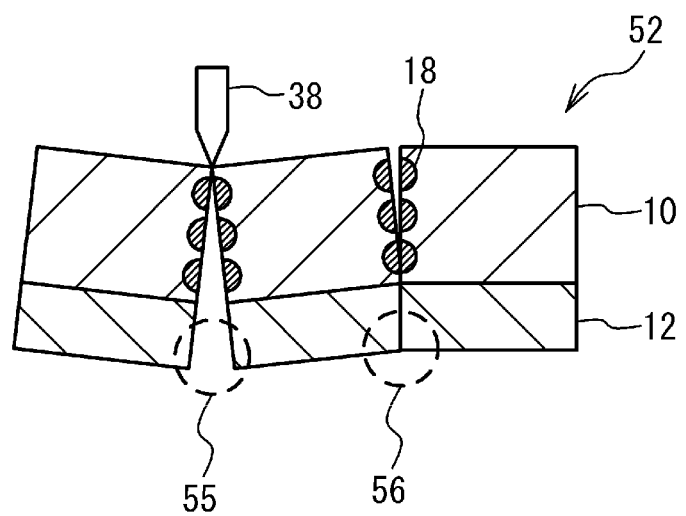

FIGS. 4A and 4B are cross-sectional views illustrating a method for manufacturing the acoustic wave device according to a comparative example 1. In the comparative example 1, a groove is not formed in the piezoelectric substrate 12, as illustrated in FIG. 4A. When the blade 38 is pressed against the wafer 50 and the wafer 50 is divided into the chips 52, the wafer 50 tries to project in a pressure direction of the blade 38. Therefore, as illustrated by a dashed line 55, portions of the piezoelectric substrate 12 of the adjoining chips 52 seek to separate mutually. In portions previously divided into the chips 52, portions of the piezoelectric substrate 12 of the adjoining chips 52 seek to overlap mutually, as illustrated by a dashed line 56. Thereby, the piezoelectric substrate 12 separates from the interface 13, and a chipping occurs. Moreover, a crack occurs in the piezoelectric substrate 12.

Figure 5A:
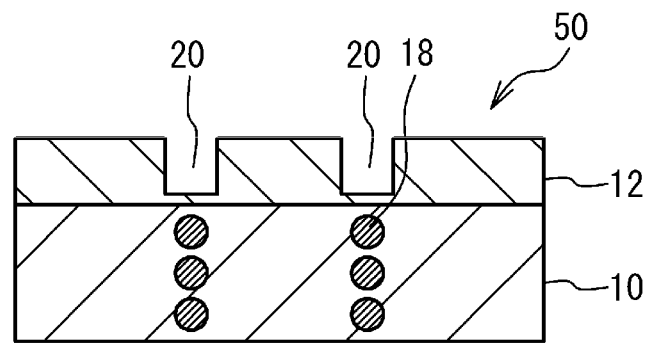
FIGS. 5A and 5B are cross-sectional views illustrating the method for manufacturing the acoustic wave device according to the first embodiment.
Figure 5B:
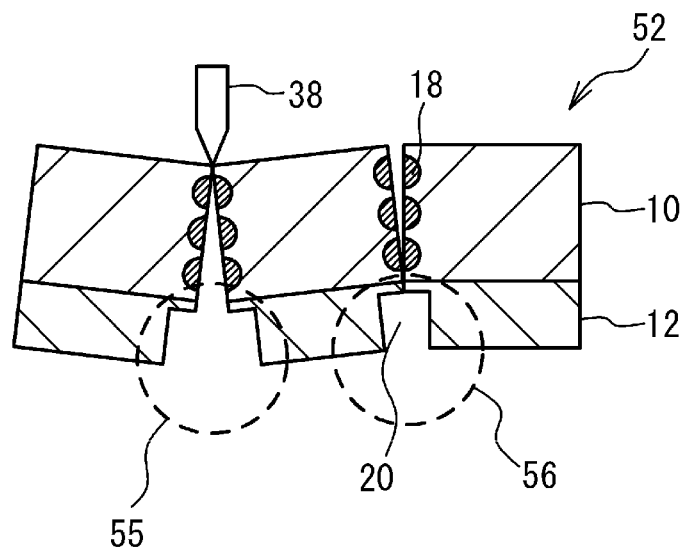

FIGS. 5A and 5B are cross-sectional views illustrating the method for manufacturing the acoustic wave device according to the first embodiment. The grooves 20 are formed so as to overlap with the altered domains 18, as illustrated in FIG. 5A. Since the portions of the piezoelectric substrate 12 escape mutually by the groove 20 in the domain of the dashed line 56 as illustrated in FIG. 5B, the portions of the piezoelectric substrate 12 do not overlap. Thereby, the occurrence of the chipping and the crack of the piezoelectric substrate 12 can be controlled.

With respect to the comparative example 1 and the first embodiment, the chipping and the crack have been checked after the wafer 50 has been cut as the chips 52. A material and each size (see FIGS. 3A and 3B) of the acoustic wave device chip 100 are as follows:

Supporting substrate: sapphire substrate
Piezoelectric substrate: 42° rotated Y-cut X-propagation lithium tantalate substrate
Film thickness T1 of supporting substrate: 250 μm
Film thickness T2 of piezoelectric substrate: 30 μm or 50 μm
Residual thickness T3 of piezoelectric substrate: 0 μm, 2.5 μm or 35 μm
Long side L1 of supporting substrate: 20 mm
Short side L2 of supporting substrate: 3.4 mm
Long side L3 of piezoelectric substrate: 19.9 mm
Short side L4 of piezoelectric substrate: 3.3 mm
Distance L5 between side surfaces 24 and 26: 50 μm Here, a condition "T3=0 μm" indicates that the piezoelectric substrate 12 does not remain in the grooves 20.

In FIG. 1C, seven altered domains 18 are formed in depths of 30 μm, 70 μm, 110 μm, 140 μm, 170 μm, 200 μm and 230 μm from the interface 13. The laser light 36 is the second harmonic of the Nd:YAG laser. In FIG. 2A, the grooves 20 are formed using the dicing blade with a blade width of 100 μm. The film thickness T2 of the piezoelectric substrate and the residual thickness T3 of the piezoelectric substrate of each sample are as follows:

Comparative Example 1

Sample 1: T2=30 μm, T3=0 μm
Sample 2: T2=50 μm, T3=0 μm

First Embodiment

Sample 3: T2=50 μm, T3=0 μm
Sample 4: T2=50 μm, T3=2.5 μm
Sample 5: T2=50 μm, T3=35 μm A chipping incidence and a crack incidence are as follows. The chipping incidence and the crack incidence indicate rates of chips in which the chipping and the crack have occurred, to all the chips 52, respectively.

Comparative Example 1

Sample 1: Chipping incidence: 0.5%, Crack incidence: 0%
Sample 2: Chipping incidence: 2.4%, Crack incidence: 1.5%

First Embodiment

Sample 3: Chipping incidence: 0.5%, Crack incidence: 0%
Sample 4: Chipping incidence: 0%, Crack incidence: 0%
Sample 5: Chipping incidence: 0%, Crack incidence: 0%

When the film thickness T2 of the piezoelectric substrate 12 is expanded to 50 μm as indicated by the samples 1 and 2 of the comparative example 1, the chipping incidence and the crack incidence become large. Even when the film thickness T2 is 50 μm as indicated by the samples 3 to 5 of the first embodiment, the chipping incidence and the crack incidence can be controlled by forming the grooves 20. When the piezoelectric substrate 12 does not remain in the grooves 20 as indicated by the sample 3, the chipping incidence increases slightly. This is because when the grooves 20 are formed in FIG. 2A, the dicing blade contacts the supporting substrate 10, a load is applied to the blade and hence the chipping is caused.

As indicated by the samples 4 and 5, the chipping incidence can be controlled by setting the residual thickness T3 of the piezoelectric substrate 12 to 5% or more and 70% or less of the film thickness T2 of the piezoelectric substrate 12. It is more desirable that T3/T2 is 10% or more, and 50% or less, or more desirable 30% or less.

Flexural strengths of the acoustic wave device according to the first embodiment and the comparative example 1 are measured. The material and each size of the acoustic wave device chip according to the first embodiment are as follows:

Supporting substrate: sapphire substrate
Piezoelectric substrate: 42° rotated Y-cut X-propagation lithium tantalate substrate
Film thickness T1 of supporting substrate: 120 μm
Film thickness T2 of piezoelectric substrate: 30 μm
Residual thickness T3 of piezoelectric substrate: 0 μm
Long side L1 of supporting substrate: 20 mm
Short side L2 of supporting substrate: 3.4 mm
Long side L3 of piezoelectric substrate: 19.9 mm
Short side L4 of piezoelectric substrate: 3.3 mm
Distance L5 between side surfaces 24 and 26: 50 μm The grooves 20 are not formed on the acoustic wave device chip of the comparative example 1, and the distance L5 between side surfaces 24 and 26 is 0. Other configuration of the acoustic wave device chip of the comparative example 1 is the same as corresponding configuration of the first embodiment.

Figure 6A:
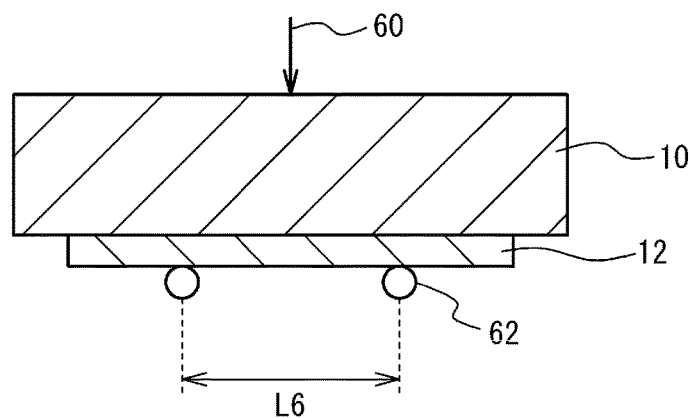
FIG. 6A is a diagram illustrating a measurement method of a flexural strength.

FIG. 6A is a diagram illustrating a measurement method of the flexural strength. As illustrated in FIG. 6A, two supporting bars 62 extending in a direction of the short side are arranged near the piezoelectric substrate 12. A distance L6 between the supporting bars 62 is 1 mm, and the supporting bars 62 are symmetrically arranged with respect to a central line of the acoustic wave device chip. A force like an arrow 60 is applied at the center of the long side of the supporting substrate 10 by the blade extending in a direction of the short side, and a strength which breaks the acoustic wave device chip is measured.

Figure 6B:
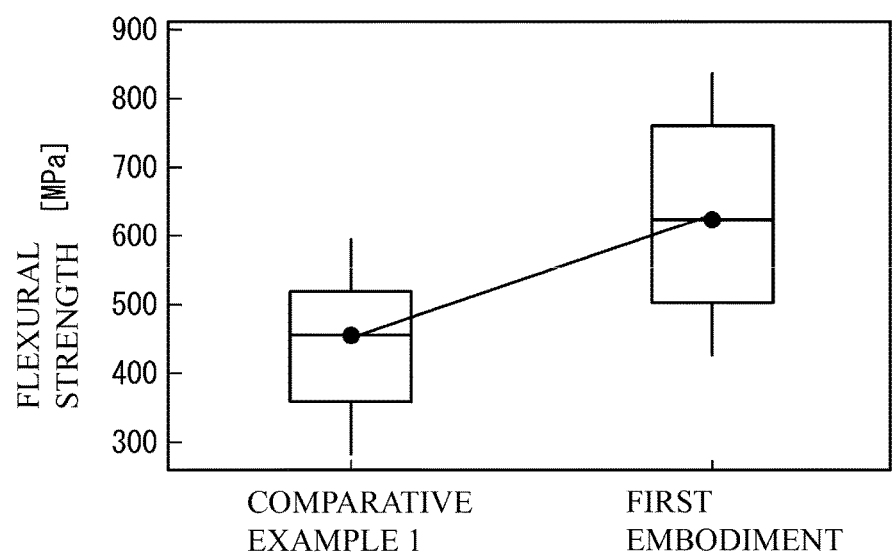
FIG. 6B is a diagram illustrating flexural strengths of the acoustic wave devices according to the comparative example 1 and the first embodiment.

FIG. 6B is a diagram illustrating flexural strengths of the acoustic wave devices according to the comparative example 1 and the first embodiment. The flexural strengths of respective 15 acoustic wave device chips according to the comparative example 1 and the first embodiment are measured. Each black circle of FIG. 6B indicate an average of the flexural strengths. A top side of each quadrangle of FIG. 6B indicates a value of data located in ¾ from below when data on the flexural strengths are arranged in ascending order. A bottom side of each quadrangle of FIG. 6B indicates a value of data located in ¼ from below when data on the flexural strengths are arranged in ascending order. A top end and a bottom end of a straight line extending up and down are a maximum value and a minimum value of the flexural strengths, respectively. An average value and a standard deviation of the flexural strengths of the comparative example 1 are 451 MPa and 87 MPa, respectively. An average value and a standard deviation of the flexural strengths of the first embodiment are 631 MPa and 136 MPa, respectively.

As described above, the flexural strength of the first embodiment is large than that of the comparative example 1. This is because the grooves 20 are formed in the first embodiment.

According to the first embodiment, the grooves 20 are formed on the upper surface of the piezoelectric substrate 12 so as to overlap with the altered domains 18 as illustrated in FIG. 2A, and the piezoelectric substrate 12 and the supporting substrate 10 are cut at the grooves 20. Thereby, the chipping and/or the crack which occur in the piezoelectric substrate 12 can be controlled.

The grooves 20 may be formed before the formation of the altered domains 18. However, bottom surfaces of the grooves 20 have poor flatness. Therefore, when the supporting substrate 10 is irradiated with the laser light 36 via the grooves 20, the laser light 36 is irregularly reflected on the bottom surfaces of the grooves 20. Accordingly, the grooves 20 are formed after the altered domains 18 are formed in the supporting substrate 10. Thereby, the laser light 36 can be controlled so as not to be irregularly reflected on the bottom surfaces of the grooves 20.

In FIG. 2A, the grooves 20 are formed so that the piezoelectric substrate 12 remains at the bottoms of the grooves 20. Thereby, the occurrence of the chipping can be more controlled. Also when the grooves 20 are formed with other thing other than the dicing blade, the interface 13 is not exposed by making the piezoelectric substrate 12 remain at the bottoms of the grooves 20, and hence the occurrence of the chipping and/or the crack can be more controlled.

When the blade 38 is pressed against the lower surface of the supporting substrate 10, so that the piezoelectric substrate 12 and the supporting substrate 10 are broken, as illustrated in FIG. 4B, it is likely to generate the chipping and/or the crack. In this case, the occurrence of the chipping and/or the crack can be controlled by forming the grooves 20. Also when the substrates are cut by another method, if the grooves 20 are not formed, the adjoining piezoelectric substrates 12 overlap with each other, and it is likely to generate the chipping and/or the crack. Therefore, it is desirable to form the grooves 20 also when another method is used.

When the supporting substrate 10 is hard compared with the piezoelectric substrate 12, the chipping and/or the crack are likely to occur in the piezoelectric substrate 12. When the supporting substrate 10 is the sapphire substrate, for example, the piezoelectric substrate 12 separates from the interface 13, and hence it becomes more likely to generate the chipping and/or the crack often. In such a case, it is effective to form the grooves 20 on the piezoelectric substrate 12.

Moreover, according to the acoustic wave device of the first embodiment, at least upper portions of the side surfaces 26 of the piezoelectric substrate 12 are located at an inner side than the side surfaces 24 of the supporting substrate 10, as illustrated in FIG. 3A. Thereby, the flexural strength can be improved as illustrated in FIG. 6B.

It is desirable that the supporting substrate 10 has a linear expansion coefficient smaller than a linear expansion coefficient of the piezoelectric substrate 12, like the sapphire substrate. A silicon substrate can be used as the supporting substrate 10, for example. Thereby, a temperature change of an electromechanical coupling coefficient of the piezoelectric substrate 12 is negated, and the characteristic of the acoustic wave device chip 100 is stabilized. Moreover, the piezoelectric substrate 12 may be a substrate other than a lithium tantalate substrate, such as a lithium niobate ($LiNbO_3$) substrate.

For example, a surface acoustic wave device, an acoustic boundary wave device, a love wave device, and a piezoelectric thin film resonator can be used as the acoustic wave device.

Although the embodiments of the present invention have been described in detail, the present invention is not limited to these specific embodiments, and the various change, substitutions, and alterations could be made hereto without departing from the spirit and scope of the invention.

What is claimed is:

1. A method for manufacturing an acoustic wave device, comprising:
    forming an altered domain in a supporting substrate by irradiating the supporting substrate with a laser light, a piezoelectric substrate being joined to an upper surface of the supporting substrate, an Interdigital Transducer (IDT) being formed on an upper surface of the piezoelectric substrate;
    forming a groove on the upper surface of the piezoelectric substrate so as to overlap with the altered domain in a planar view and be not formed in the supporting substrate, the formation of the groove being performed before or after, and not at the same time as, the formation of the altered domain in the supporting substrate; and
    cutting the supporting substrate at the groove after forming the altered domain and forming the groove on the upper surface of the piezoelectric substrate,
    wherein a depth of the groove is 30% or more of a thickness of the piezoelectric substrate,
    wherein a width of the groove is greater than the thickness of the piezoelectric substrate.

2. The method for manufacturing the acoustic wave device according to claim 1, wherein the formation of the groove is performed after the formation of the altered domain.

3. The method for manufacturing the acoustic wave device according to claim 1, wherein the formation of the groove is performed so that the piezoelectric substrate remains at a bottom of the groove.

4. The method for manufacturing the acoustic wave device according to claim 3, wherein a residual thickness of the piezoelectric substrate at the groove is 5% or more and 70% or less than the thickness of the piezoelectric substrate.

5. The method for manufacturing the acoustic wave device according to claim 1, wherein
    the cutting of the supporting substrate includes breaking the supporting substrate by pressing a blade against the supporting substrate.

6. The method for manufacturing the acoustic wave device according to claim 1, wherein
    the supporting substrate is a sapphire substrate.

7. The method for manufacturing the acoustic wave device according to claim 1, wherein
    the cutting of the supporting substrate includes breaking the supporting substrate by pressing a blade against a lower surface of the supporting substrate.

8. The method for manufacturing the acoustic wave device according to claim 7, wherein the forming the groove on the upper surface of the piezoelectric substrate includes forming the groove on the upper surface of the piezoelectric substrate by using a dicing blade.

9. The method for manufacturing the acoustic wave device according to claim 7, wherein the breaking the supporting substrate includes dividing the supporting substrate and the piezoelectric substrate into a plurality of chips so as not to overlap the piezoelectric substrate of adjacent chips among the plurality of chips.

10. The method for manufacturing the acoustic wave device according to claim 1, wherein
    the supporting substrate is a sapphire substrate and the piezoelectric substrate is a lithium tantalite substrate.

11. The method for manufacturing the acoustic wave device according to claim 1, wherein the depth of the groove is 50% or more of the thickness of the piezoelectric substrate.

12. A method for manufacturing an acoustic wave device, comprising:
    forming an altered domain in a supporting substrate by irradiating the supporting substrate with a laser light, a piezoelectric substrate being joined to an upper surface of the supporting substrate, an Interdigital Transducer (IDT) being formed on an upper surface of the piezoelectric substrate;
    forming a groove on the upper surface of the piezoelectric substrate so as to overlap with the altered domain in a planar view and be not formed in the supporting substrate, the formation of the groove being performed before or after, and not at the same time as, the formation of the altered domain in the supporting substrate; and
    cutting the supporting substrate at the groove after forming the altered domain and forming the groove on the upper surface of the piezoelectric substrate,
    wherein a depth of the groove is 30% or more of a thickness of the piezoelectric substrate, and
    wherein the groove is not in contact with the altered domain.

13. A method for manufacturing an acoustic wave device, comprising:
    forming an altered domain in a supporting substrate by irradiating the supporting substrate with a laser light, a piezoelectric substrate being joined to an upper surface of the supporting substrate, an Interdigital Transducer (IDT) being formed on an upper surface of the piezoelectric substrate;
    forming a groove on the upper surface of the piezoelectric substrate so as to overlap with the altered domain in a planar view and be not formed in the supporting substrate, the formation of the groove being performed before or after, and not at the same time as, the formation of the altered domain in the supporting substrate; and
    cutting the supporting substrate at the groove after forming the altered domain and forming the groove on the upper surface of the piezoelectric substrate,
    wherein a depth of the groove is 30% or more of a thickness of the piezoelectric substrate, and
    wherein there is a gap between a bottom of the groove and a top of the altered domain.

* * * * *